United States Patent
Hoshino et al.

(10) Patent No.: US 8,257,492 B2
(45) Date of Patent: Sep. 4, 2012

(54) METHODS FOR PURIFYING METALLURGICAL SILICON

(76) Inventors: Masahiro Hoshino, Los Altos, CA (US); Cheng C. Kao, Los Altos, CA (US)

( * ) Notice: Subject to any disclaimer, the term of this patent is extended or adjusted under 35 U.S.C. 154(b) by 7 days.

(21) Appl. No.: 12/947,777

(22) Filed: Nov. 16, 2010

(65) Prior Publication Data

US 2011/0114012 A1  May 19, 2011

Related U.S. Application Data

(60) Provisional application No. 61/374,202, filed on Aug. 16, 2010.

(30) Foreign Application Priority Data

Nov. 16, 2009 (TW) .................. 98138830 A (51) Int. Cl.
 *C30B 28/00* (2006.01)
(52) U.S. Cl. ........... 117/37; 117/2; 117/4; 117/11; 117/41; 117/42; 117/933
(58) Field of Classification Search .......... 117/2, 4, 117/11, 37, 41, 42, 933
See application file for complete search history.

(56) References Cited

U.S. PATENT DOCUMENTS

| 4,298,423 A | 11/1981 | Lindmayer |
| 4,865,643 A | 9/1989 | Goins, Jr. et al. |
| 5,182,091 A * | 1/1993 | Yuge et al. ............ 423/348 |
| 5,961,944 A * | 10/1999 | Aratani et al. ......... 423/348 |
| 6,090,361 A * | 7/2000 | Baba et al. ............ 423/350 |
| 2006/0048698 A1* | 3/2006 | Hall et al. ............. 117/54 |
| 2006/0054081 A1* | 3/2006 | Lan et al. ............. 117/217 |
| 2008/0311020 A1* | 12/2008 | Ito et al. ............... 423/349 |
| 2009/0130014 A1* | 5/2009 | Fukuyama et al. ...... 423/349 |
| 2010/0178195 A1 | 7/2010 | Yamada et al. |

FOREIGN PATENT DOCUMENTS

| JP | 05-262512 A | 10/1993 |
| JP | 2001-526171 A | 12/2001 |
| JP | 2001526171 A | 12/2001 |

(Continued)

OTHER PUBLICATIONS

The International Search Report for PCT/US2011/024572 filed on Feb. 11, 2011.

(Continued)

*Primary Examiner* — Matthew Song
(74) *Attorney, Agent, or Firm* — Richard T. Ogawa; Ogawa P.C.

(57) ABSTRACT

A method for purifying silicon bearing materials for photovoltaic applications includes providing metallurgical silicon into a crucible apparatus. The metallurgical silicon is subjected to at least a thermal process to cause the metallurgical silicon to change in state from a first state to a second state, the second stage being a molten state not exceeding 1500 Degrees Celsius. At least a first portion of impurities is caused to be removed from the metallurgical silicon in the molten state. The molten metallurgical silicon is cooled from a lower region to an upper region to cause the lower region to solidify while a second portion of impurities segregate and accumulate in a liquid state region. The liquid state region is solidified to form a resulting silicon structure having a purified region and an impurity region. The purified region is characterized by a purity of greater than 99.9999%.

14 Claims, 7 Drawing Sheets

FOREIGN PATENT DOCUMENTS

| | | |
|---|---|---|
| JP | 2007326749 A | 12/2007 |
| JP | 2008-308383 A | 12/2008 |
| KR | 10-0966755 B1 | 6/2010 |
| KR | 100966755 B1 | 6/2010 |
| WO | WO 2008/149985 A1 | 12/2008 |

OTHER PUBLICATIONS

Office Action and List of References for U.S. Appl. No. 13/024,292 mailed Oct. 27, 2011 from the United States Patent and Trademark Office.

N. Yuge et al., "Purification of Metallurgical-Grade Silicon up to Solar Grade", Progress in Photovoltaics, May/Jun. 2001, pp. 203-209, vol. 9-3.

Office Action and List of References for U.S. Appl. No. 13/187,282 mailed Dec. 9, 2011 from the United States Patent and Trademark Office.

C.P. Khattak et al., "Production of Solar Grade (SoG) Silicon by Refining Liquid Metallurgical Grade (MG) Silicon", National Renewable Energy Laboratory, Apr. 19, 2001.

Written Opinion for PCT/US2011/024572 filed on Feb. 11, 2011.

International Search Report for PCT/US2010/056903 filed on Nov. 16, 2010.

Written Opinion for PCT/US2010/056903 filed on Nov. 16, 2010.

Office Action and List of References for U.S. Appl. No. 13/024,292 mailed Mar. 21, 2012 from the United States Patent and Trademark Office.

International Search Report for PCT/US2011/044890 filed on Jul. 21, 2011.

Written Opinion for PCT/US2011/044890 filed on Jul. 21, 2011.

Office Action and List of References for U.S. Appl. No. 13/187,282 mailed Mar. 23, 2012 from the United States Patent and Trademark Office.

Liang et al., "Study on the Recycle of Solar Grade Silicon From Waste IC Wafers," Proceedings of ISES Solar World Congress 2007: Solar Energy and Human Settlement, pp. 1189-1193.

\* cited by examiner

METHODS FOR PURIFYING METALLURGICAL SILICON

FIELD OF THE INVENTION

The present invention relates to methods for purifying metallurgical grade silicon suitable for use in manufacturing solar cells.

BACKGROUND OF THE INVENTION

Silicon used for manufacturing solar cells is produced commonly by the so-called Siemens method. The Siemens method is well-established, and is commonly used to manufacture solar cells. In the Siemens process, silgrain (>99.6% purity) is used. Silgrain is then reacted with hydrochloric acid in the presence of a copper catalyst. The main product obtained is trichlorosilane (SiHCl3), which is purified through fractional distillation. The separated SiHCl3 is decomposed and reduced at high temperature on high-purity silicon rods. For each mole Si converted to polysilicon, 3 to 4 moles of SiCl4 is produced, binding large amounts of chlorine and valuable silicon. The resulting polysilicon has typically an impurity level of 10-9. The Siemens method produces high quality silicon. However, the Siemens method is not well suited to meet the dramatic increase in demand over the past few years for silicon at competitive prices. In addition, it involves dangerous raw materials such as HCl, SiHCl3, and H2 during the manufacturing process and produces a poisonous by-product, SiCl4. The Siemens method is dangerous, and it is hazardous to personnel and the environment.

Another purification method is disclosed in Japanese Patent No. 3205352 (JP352), the teachings of which are incorporated herein by reference. JP 352 method involves removing phosphorous by high temperature electron beams, removing impurity with directional cooling, adding water and gases to remove boron carbide during plasma irradiation, and removing impurity with directional cooling again. Each of these steps is performed sequentially. Although JP352 uses a simple structure to perform silicon purification, the simplicity of the design appears to result in various purification steps interfering with each other, which compromises the purification process.

A more cost-effective method for purifying metallurgical silicon is needed to meet the increasing demand for purified silicon.

SUMMARY OF THE INVENTION

The conventional manufacturing methods are sufficient in terms of being capable of producing silicon with the purity level required for manufacturing solar cells. However, they have inherent safety and environmental problems that are not easy to eliminate. In addition, initial and ongoing manufacturing costs of the methods are high, and they are not very flexible.

The present invention improves upon the conventional apparatus and method used for manufacturing single-crystal silicon. The present invention is able to mass produce solar-grade silicon (or polysilicon) while providing manufacturing flexibility and a competitive price.

Embodiments of the present invention include performing one or more of the following purifying processes for metallurgical grade silicon (or metallurgical silicon):

Independent Gas Provision: An independent supply tube supplies highly pressurized O2 gas towards H2 supplied by the plasma arc heater to the center of the surface of the silicon melt in the crucible so as to generate water vapor (H2O). The resulting water vapor is injected into the silicon melt as a result of the high-pressure ejection of O2, thereby providing the silicon melt with the water vapor that is needed to remove impurities.

Providing Intermittent Heating and Gas: Irradiation of the silicon melt in the crucible is intermittently performed by the plasma arc heater, so that the temperature at the surface of the silicon melt in the crucible is heated to a reproducible temperature gradient, e.g., hotter temperature at the middle of the silicon melt than at the outer portion that contacts the crucible. This in turn forms a temperature distribution across the silicon melt in the crucible, preventing the crucible from melting and providing stable and uniform conditions for metallurgical silicon purification. In addition, purifying gases for forming the water vapor are provided intermittently to avoid a rise in pressure caused by continuous provision of the water vapor, thus providing a safe and stable process environment for purifying metallurgical silicon.

Addition of Chemicals: Chemicals such as Ca, Si and Mg are added to the silicon raw material to react with the impurities therein, and the resulting compounds have relative densities lower than metallurgical silicon, which facilitates removal of the impurities. In an implementation, a method includes adding soluble chemicals, whose vitreous structures may be network modifiers including, for example, calcium chloride (CaCl2) and magnesium chloride (MgCl2), and network formers including, for example, sodium metasilicate (Na2SiO3). These soluble chemicals contact or blend with the impurities in the silicon raw material to form slag which floats up to the silicon melt surface and may be easily evaporated.

Silicon Melt Mixing: By ejecting purifying gases with high pressure via the supply tube towards the surface of the silicon melt in the crucible at the same time that H2O is provided to the silicon melt, the stream of high-pressure purifying gases forms a dimple on the silicon melt surface, thereby increasing the contact area for H2O. Meanwhile, circulation within the silicon melt in the crucible is facilitated due to heat convection resulting from the temperature gradient across the silicon melt in the crucible, which is caused by irradiating the melt with the plasma arc heater.

Vacuum Control: By changing the degree of vacuum in the vessel, evaporation conditions of the impurities in the silicon raw material can be controlled while avoiding superheating of the silicon melt, thus ensuring the safety of the metallurgical silicon purifying process.

Crucible Shifting: The crucible is moved, for example by rotating and/or shifting vertically and/or horizontally, relative to the heater by the manipulating mechanism provided underneath the vessel. Moving the crucible can move the solidus-liquidus interface of the silicon melt to achieve one-directional cooling purification, without the need for temperature segregation coefficient management of the concentration of remaining impurities in the silicon melt with respect to the solidus-liquidus line.

In an embodiment, one or more of the above techniques are performed at the same time in the same apparatus. In another embodiment, all of the above techniques are performed at the same time in the same apparatus. The embodiments of the present invention do not require a new manufacturing apparatus to be installed; rather, a conventional apparatus used for manufacturing single-crystal silicon can be adapted to practice the methods on a mass production scale. Because of this, both the fixed and variable costs of manufacturing can be reduced.

As mentioned above, the silicon purifying method of the embodiments of the present invention involves adjusting an existing and widely used apparatus. The adjustments are simple, minimizing additional costs, and manufacturing flexibility is ample, so the method can be adjusted to satisfy market demands as necessary. The methods are capable of substantially reducing the costs and time required to purify metallurgical silicon for use in manufacturing solar cells and other suitable devices.

In addition to cost-effective purification, the methods according to embodiments of the present invention do not produce the amount of poisonous or dangerous substances found in the conventional art, resulting in a safer workplace that is better able to meet increasing levels of environmental regulation.

In an embodiment, a method for purifying metallurgical grade silicon into solar-grade silicon includes one or more of the following steps performed at the same time. An independent gas provision step uses an independent supply tube for supplying at least one highly pressurized gas towards burning hydrogen (H2) supplied by the plasma arc heater to the center of the surface of a silicon melt in a crucible, so as to generate a purifying substance for the silicon melt, with the generated purifying substance going into the silicon melt as a result of the high-pressure ejection of the purifying gas to effectively provide the silicon melt with the purifying substance, which is needed for the removal of impurities in the silicon melt. An intermittent heating and gas provision step intermittently performs irradiation of the silicon melt in the crucible by the plasma arc heater, so that the temperature at the surface of the silicon melt in the crucible forms a reproducible temperature gradient, which in turn forms a temperature distribution across the silicon melt in the crucible, and in addition, by controlling the purifying gas, intermittently providing enough purifying gas to the silicon melt surface to form the purifying substance, so as to provide a stable process for purifying metallurgical silicon. A chemical-adding step adds and blends substances including the impurities and/or silicon into the silicon melt so that the resulting compounds formed have relative densities smaller than the metallurgical silicon. A silicon melt mixing steps ejects the purifying gases with high pressure to the surface of the silicon melt in the crucible, so that at the same time the purifying substance is provided to the silicon melt, the stream of the high-pressure purifying gas forms a dimple on the silicon melt surface, increasing the contact area for the purifying substance, and meanwhile, the area with high temperate is increased by irradiating the plasma via the dimple, accompanied by heat convection caused by different temperatures across the silicon melt in the crucible, circulation within the silicon melt in the crucible is encouraged. A vacuum controlling step changes the degree of vacuum in a vessel of the apparatus to provide evaporation conditions of the impurities in the silicon starting material and for preventing superheating in the silicon melt, thus ensuring the safety of the process for purifying metallurgical silicon. A crucible shifting step rotates and/or vertically and/or horizontally shifts the crucible relative to the location of the heater by a manipulating mechanism provided underneath the vessel, so as to move the solidus-liquidus interface of the silicon melt to achieve one-directional cooling purification, without the need for temperature segregation coefficient management of the concentration of remaining impurities in the silicon melt with respect to the solidus-liquidus line.

In an embodiment, the purifying gas is oxygen (O2). The high-pressure oxygen provided to the center of the silicon melt surface and the burning hydrogen supplied by the plasma arc heater generate water vapor (H2O) through a hydrogen burning reaction, and the generated water vapor goes into the silicon melt as a result of the high-pressure ejection of the oxygen gas to effectively provide the purifying substance, water, needed for the removal of impurities in the silicon melt. The temperature range or distributions is formed in the silicon melt from 1450° C. to 3527° C. under one atmospheric pressure (the standard pressure).

According to an embodiment, in the intermittent heating and gas provision step, the duty cycle of intermittent plasma irradiation is below 50%.

According to an embodiment, in the intermittent heating and gas provision step, a temperature difference of 50° C. or above is formed in the crucible. A pressure pump is further provided to adjust the pressure before the purifying substance evaporates from liquid to gas and causes the pressure to rise.

According to an embodiment, the plasma arc heater locally irradiates the silicon melt to generate a local high temperature, and hydrogen is locally provided to the silicon melt. A material that generates oxygen and hydrogen is added, the material being water.

According to an embodiment, a material that generates monosilanes, oxygen and hydrogen is added. The material is argon (Ar).

According to an embodiment, a high-pressure and damped argon gas is ejected by the plasma arc heater to form local temperature differences in the silicon melt, and the time for purifying is reduced by increasing the contact area with the silicon melt through the dimple and the circulation caused by the dimple.

According to an embodiment, in the chemical-adding step, the chemicals added eventually generate a chloride substance. The added chemicals include compounds of calcium, silicon and magnesium, which blend with the silicon starting material. The added chemicals include soluble chemicals, and their vitreous structures are network modifiers, including calcium chloride (CaCl2) and magnesium chloride (MgCl2), and network formers, including sodium metasilicate (Na2SiO3).

According to an embodiment, in the vacuum controlling step, the degree of vacuum is controlled by a vacuum machine and the degree of vacuum is kept in a range between 0.1 Torr and 10 Torr.

According to an embodiment, in the crucible shifting step, the bottom of the crucible is positioned next to the bottom of the heater to reduce its bottom temperature and align the center of the heater with the center of the crucible.

According to an embodiment, a method for purifying silicon bearing materials for photovoltaic applications includes providing metallurgical silicon into a crucible apparatus. The metallurgical silicon is subjected to at least a thermal process to cause the metallurgical silicon to change in state from a first state to a second state, the second stage being a molten state not exceeding 1500 Degrees Celsius. At least a first portion of impurities is caused to be removed from the metallurgical silicon in the molten state. The molten metallurgical silicon is cooled from a lower region to an upper region to cause the lower region to solidify while a second portion of impurities segregate and accumulate in a liquid state region. The liquid state region is solidified to form a resulting silicon structure having a purified region and an impurity region. The purified region is characterized by a purity of greater than 99.9999%.

In an embodiment, the thermal process uses a plasma gun or arc heater.

In an embodiment, the crucible apparatus remains in a stationary state.

In an embodiment, the thermal process has a source of about 3000 Degrees Celsius.

In an embodiment, the molten metallurgical silicon has a temperature profile characterized by a higher temperature region within a center region and a lower temperature region within an edge region of the crucible apparatus.

In an embodiment, the thermal process comprises a thermal pulse or pulses.

In an embodiment, the thermal process comprises a convection process of the molten state.

In an embodiment, the molten state is substantially free from any foreign objects for circulating the molten metallurgical silicon.

In an embodiment, the method further comprises subjecting an upper molten region of the metallurgical silicon with an inert blanket of gas; and subjecting a portion of the upper molten region to a hydrogen gas to cause a reaction and remove a boron impurity with the hydrogen gas to remove the oxygen impurity, wherein the metallurgical silicon has a purity of about 99%.

In an embodiment, the method further comprises subjecting a region of the molten metallurgical silicon to a hydrogen species to remove a boron impurity using a gas selected from at least one of $B_2O_3$, $B_2O_3H_2O$, $BH_4$, $B_2H_6$, $BH_3$, $H_3BO_3$, $HBO_2$, $HBO_3$, $H_4B_2O_4$, $H_3BO_2$, $H_3BO$, $H_2B_4O_7$, $B_2O_2$, $B_4O_3$ or $B_4O_5$.

In an embodiment, the hydrogen species is injected using one or more channel regions.

In an embodiment, the crucible is maintained in a vacuum to keep the molten metallurgical silicon free from external contaminants.

In an embodiment, the vacuum is selected to achieve a desired impurity removal characteristic from the molten metallurgical silicon.

According to an embodiment of the present invention, a method for purifying silicon for photovoltaic applications includes providing metallurgical silicon into a crucible apparatus; subjecting the metallurgical silicon to at least a thermal process to cause the metallurgical silicon to change in state from a first state to a second state; causing at least a portion of impurities from being removed from the metallurgical silicon in the molten state; and maintaining the metallurgical silicon in a vacuum to selectively adjust a temperature of the molten state of the metallurgical silicon.

In an embodiment, the method further comprises subjecting the crucible apparatus to a cooling process using one or more cooling tubes, wherein the metallurgical silicon has a purity of about 99%.

According to an embodiment of the present invention, a method for purifying silicon bearing materials for photovoltaic applications includes providing metallurgical silicon into a crucible apparatus; subjecting the metallurgical silicon to at least a thermal process to cause the metallurgical silicon to change in state from a first state to a second state, the second stage being a molten state not exceeding 1500 Degrees Celsius; causing at least a first portion of impurities from being removed from the metallurgical silicon in the molten state; subjecting an upper molten region of the metallurgical silicon with an inert blanket of gas to prevent external impurities from contacting the metallurgical silicon in the molten state; and subjecting a portion of the upper molten region to a hydrogen gas to cause a reaction to cause removal of a boron impurity with the hydrogen gas.

In an embodiment, boron impurity is removed using a gas selected from at least one of $B_2O_3$, $B_2O_3H_2O$, $BH_4$, $B_2H_6$, $BH_3$, $H_3BO_3$, $HBO_2$, $HBO_3$, $H_4B_2O_4$, $H_3BO_2$, $H_3BO$, $H_2B_4O_7$, $B_2O_2$, $B_4O_3$ or $B_4O_5$.

In an embodiment, the hydrogen species is injected using one or more channel regions.

According to an embodiment of the present invention, a method for purifying silicon bearing materials for photovoltaic applications includes providing metallurgical silicon having a purity of 99% into a crucible apparatus; and subjecting the metallurgical silicon to at least a thermal process to cause the metallurgical silicon to change in state from a first state to a second state, the second state of the metallurgical silicon including an inner portion having a temperature ranging from about 2500 to 3000 Degrees Celsius and an outer portion having an outer temperature not exceeding 1500 Degrees Celsius; and causing a convective current from a temperature differential between the inner portion and the outer portion of the metallurgical silicon.

DETAILED DESCRIPTION OF THE EMBODIMENTS

The present invention relates to methods for purifying metallurgical silicon. An embodiment of the prevent invention includes an independent gas provision step, an intermittent heating and gas provision step, a chemical-adding step, a silicon melt mixing step, a vacuum controlling step, and a crucible shifting step. According to implementation a plurality or all of these steps may be performed at the same time in the same apparatus to generate solar-grade silicon in mass production without using any poisonous chemicals. Various aspects of the present invention are described using the embodiments described herein. A person skilled in the art would understand that the examples and embodiments described herein are for illustrative purposes only and that various modifications or changes thereof would be possible without departing from the spirit and purview of this invention.

Figure 1:
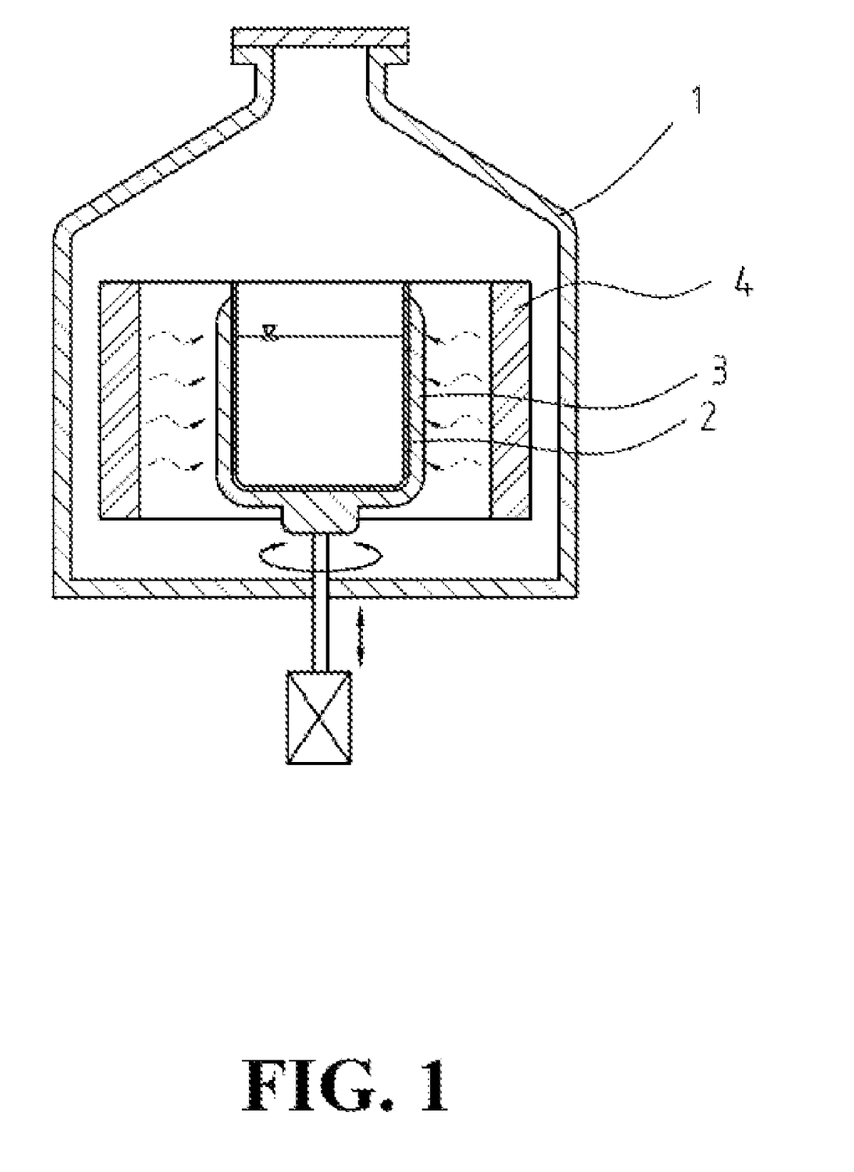
FIG. 1 is a cross-sectional diagram depicting a simplified conventional apparatus for growing single silicon crystals.
Figure 2:
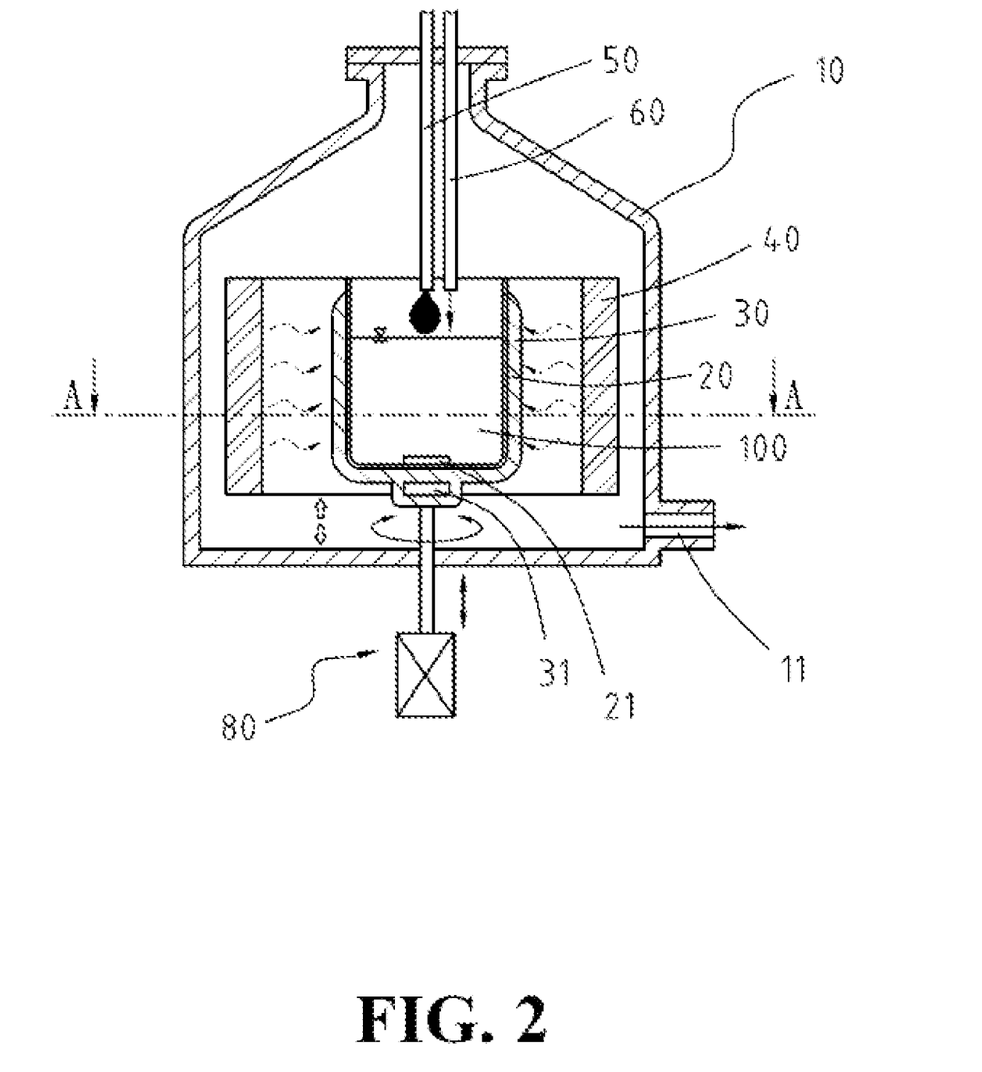
FIG. 2 is a cross-sectional diagram depicting a simplified silicon purifying apparatus according to an embodiment of the present invention.
Figure 3:
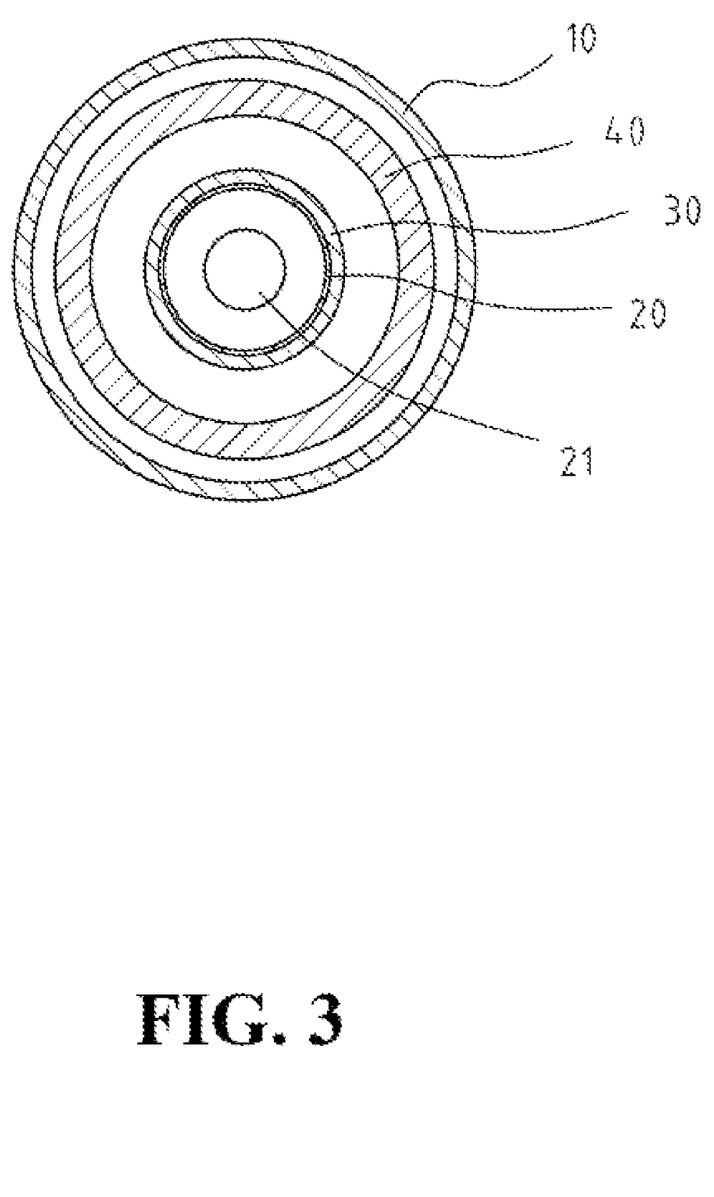
FIG. 3 is a cross-sectional diagram along line A-A of FIG. 2.

FIG. 1 shows a cross-sectional diagram depicting a simplified conventional apparatus used for growing single silicon crystals. A vessel 1 contains a crucible 2 supported by a crucible support 3 and heated by a heater 4.

Single-crystal growing techniques, which purify a solid part while growing crystals in the same crystalline orientation as the seed crystal based on the difference in the segregation coefficient between solidus and liquidus, are widely used for manufacturing of semiconductor apparatus and are well known in the art.

The present inventors have proposed methods for purifying low-purity metallurgical silicon, such as metallurgical silicon used in the steel or aluminum industries, to produce solar-grade silicon by re-designing the traditional apparatus used for single-crystal silicon growth.

Embodiments of the present invention provide a new method for purifying metallurgical silicon that enhances the efficiency and effect of the various functions such as purification, stabilization, ignition, and circulation. In an embodiment, the metallurgical silicon used has a purity of about 99%. In another embodiment, the silicon used may have a different purity level.

In other words, the present invention devises a new independent gas supply for supplying gases for stable and efficient plasma. The plasma arc heater is arranged in such a way that it does not interfere with other means for improving purification and maintains the stable use condition for other purification techniques used according to the present invention.

An embodiment of the present invention provides, an independent gas supply for different purification gases, e.g., H2 and O2, so that an increased amount of H2, H2O and O2 reach the silicon melt in the crucible. The purification gases including O and H are directly blown onto the surface of the silicon melt. These gases easily react with impurities in the silicon melt, such as boron, and produce boron compounds which are easily evaporated. Examples of boron compounds that are difficult to remove from silicon melt by conventional methods but are readily removed according to an embodiment of the present invention include the following: B2O3, B2O3H2O, BH4, B2H6, BH3, H3BO3, HBO2, HBO3, H4B2O4, H3BO2, H3BO, H2B4O7, B2O2, B4O3, B4O5, etc. In addition, the apparatus and methods disclosed herein may apply to the purification of other elements.

By providing an independent gas supply inlet purification gases H2 and O2, a greater amount of these gases are allowed to reach the surface of the silicon melt for reaction with impurities in the silicon melt. If H2 and O2 provided through the same inlet, much of these purification gases would react with each other before they reach the surface of the silicon melt.

Another feature of the present embodiment resides in the intermittent provision of plasma and purifying gases. The differences between intermittent and continuous provision are now compared.

When providing plasma continuously to the surface of the silicon melt according to the conventional art, the temperature of the silicon in the crucible 2 increases over time, and it is therefore necessary to lower the power of the plasma to avoid melting the crucible. Because of this, the temperature of the silicon varies with time, so that the temperature distribution across the silicon is not uniform. As a result, the purification conditions also vary with time.

In the present embodiment, the power to the plasma is supplied intermittently. As a result, the temperature of the silicon of the present embodiment also increases with time according to a pattern after certain time intervals and repetitive intermittences, i.e., it varies in a reproducible manner. The pattern may be a constant pattern. Thus, the temperature gradient may have reproducible changes, so stable purification can be achieved in mass production.

When providing purifying gases continuously, as described above, the temperature inside the plasma arc heater will increase due to gas combustion. Furthermore, if H2O is continuously provided for purification, according to the Avogadro constant, the pressure will increase and pose a danger to the system. Therefore, an adequate amount of H2O for efficient purification of the silicon cannot be supplied through the continuous process. Consequently, a compromise must be made between increases in temperature and pressure, and the amount of H2O supplied.

The present embodiment adopts the intermittent approach of supply by providing purification gases periodically, where purification gases are supplied during one period and then not supplied in another period, and so on. Using the intermittent method, a desired amount of H2O is provided for purification. In an embodiment, the amount of H2O supplied is fined tuned during the purification process as needed. In addition, a pressure pump is provided to reduce pressure before H2O vaporizes from the liquid phase and increases the pressure in the chamber. Thus, the present embodiment is able to perform stable purification under safe and reproducible conditions.

A method for purifying metallurgical silicon according to an embodiment of the present invention is provided below.

Manufacturing Steps in Present Embodiment:

| Sequence | Description |
|---|---|
| Step One | Generate partial high temperature by plasma irradiation<br>Efficiently remove impurities via a vacuum<br>Directly supply water and gases towards the surface of the silicon melt<br>Efficiently and uniformly supply water and gases into the silicon melt in the crucible<br>Allow the silicon melt to efficiently circulate inside crucible<br>Intermittently provide plasma and purification gases to achieve a safe process, maximize purification, and reduce power consumption |
| Step Two | Remove impurities with one directional cooling by crucible shifting |

In the method disclosed above, the purification is performed by performing a plurality of purification techniques in the same apparatus at the same time, so as to achieve up to four different purification reactions: physical, chemical, mechanical and metallurgical. In another embodiment, the purification method may perform only one purification technique or all the purification techniques disclosed above.

An embodiment of the present invention is now described in detail in order to enable one with ordinary skills in the art to fully understand and reproduce and practice the present invention. Although the embodiment is described using the conventional apparatus shown in FIG. 1, one of skill in the art will appreciate that the present invention may be implemented using a different apparatus.

First, when chemically purifying silicon raw material containing impurities, the silicon raw material is heated to 1500° C. by the heater 4. Meanwhile, Argon (Ar) gas is provided at 800 L/hour to the vessel 1 to prevent oxidation of the silicon melt.

Since the silicon raw material contains a variety of metal impurities having different inherent evaporation temperatures, in order to remove them, the crucible 2 is heated to temperatures corresponding to the different evaporation temperatures. A temperature gradient is generated in the crucible 2. The resulting temperature distributions in the silicon melt in the crucible enables the impurities having different evaporation temperatures to be evaporated.

The actual evaporation, or boiling point, temperatures of some typical metal elements under one atmospheric pressure that might be observed in the silicon raw material are listed below:

Al: 2327° C.
Sb: 1617° C.
B: 3527° C.
Ca: 1482° C.
Cu: 2595° C.
Mn: 2097° C.

Fe: 2727° C.

Ni: 2837° C.

Ti: 1457° C.

Thus, the crucible 2 would need to tolerate temperatures between 1457° C. and 3527° C. for evaporation of the above metal impurities. Typically, the temperature of the silicon in the crucible 2 ranges from 1450° C. to 1550° C. In an embodiment, however, the temperature gradient of the silicon melt in the crucible is provided to have a temperature distribution from 1457° C. to 3527° C. under one atmospheric pressure, thereby enabling evaporation of boron at 3527° C.

Second, the pressure within the vessel is kept at 10 Torr and the vessel is supplied with $H_2O$, so as to allow the impurities in the silicon raw material to produce compounds that are more easily evaporated. Meanwhile, a temperature gradient is formed on the surface of the silicon melt in the way described below in order to allow all resulting compounds to reach their inherent evaporating temperatures. Because the pressure in the vessel is lower than atmospheric pressure, the actual evaporation temperatures of the impurities will be lower than the reference values listed above.

In order to irradiate the plasma to achieve the desired temperature gradient, the power of the plasma is adjusted to 20 KW, and the diameter of the irradiation area is adjusted to below 10 mm. Intermittent irradiation is used to limit any increase in the overall temperature of the silicon melt as a result of the plasma irradiation. Based on experimentation conducted by the present inventors, a temperature gradient such as that shown in FIG. 6 can be observed when the duty cycle is below 50%.

As noted above, in order to remove metal impurities in the silicon, it is necessary to reach various evaporating temperatures for the impurities using the temperature of the crucible 2 as a reference point. According to the temperatures listed above, the greatest temperature difference formed in the melt is 2077° C., resulting from a temperature distribution of 1450° C. to 3527° C., and the smallest temperature difference is 7° C., resulting from a temperature distribution of 1450° C. to 1457° C. However, in light of actual operations and tests and considering safety management under high temperatures, it is preferred that the temperature difference of the crucible 2 be kept within 1500° C.+/−50° C.

In theory, it is quite difficult to perform removal of boron impurities using the segregation method. However, when $H_2O$ is added to silicon having the temperature gradient described above, the boron-bearing content of the raw material is lowered to an average of 0.3 ppm from 30 ppm, thereby achieving purification. In addition to reaction with $H_2O$, the compounds in $H_2O$, such as O and H, chemically react with the boron impurities in the silicon raw material and form chemicals that are easily evaporated, such as $B_2O_3$, $B_2O_3H_2O$, $BH_4$, $B_2H_6$, $BH_3$, $H_3BO_3$, $HBO_2$, $HBO_3$, $H_4B_2O_4$, $H_3BO_2$, $H_3BO$, $H_2B_4O_7$, $B_2O_2$, $B_4O_3$ and $B_4O_5$.

Moreover, in regard to removing impurities in the silicon raw material, calcium (Ca), silicon (Si) and magnesium (Mg) chemical compounds are blended into the silicon raw material in order to react with the impurities and form slag.

Because silicon raw material has different shapes and sizes, it is very difficult for additives to completely and uniformly come into contact with the silicon raw material. In order to solve this problem, soluble calcium chloride ($CaCl_2$), magnesium chloride ($MgCl_2$), and sodium silicate ($Na_2SiO_3$), are blended with the raw material. The result is that the levels of impurities are almost the same across the whole resulting purified silicon. This indicates a uniform purification using soluble additives.

In the present embodiment, the concentrations of Ca and Mg, which are used as network modifiers, and Si, which is used as a network former, in vitrification, are all set to 100 ppm with respect to the silicon raw material. However, in other embodiments, the appropriate concentrations may vary with the impurities incorporated in the silicon raw material.

In addition, among the various chemical compounds formed from added Ca and Mg, such as oxide, chloride and carbonic acid, chloride gives high purity even when the process begins with a silicon raw material having impurity levels of 97~98%. The main reason for this is that the chloride impurities in the silicon raw material have high vapor pressure, and thus they can be easily removed.

In order to efficiently remove boron-based impurities according to the prior art, it is necessary to add $H_2O$ to the silicon melt. However, the surface temperature of the silicon melt is as high as 1450° C.~1550° C., so $H_2O$ will evaporate before reaching the surface. As a result, the boron-based impurities are not removed efficiently. A solution proposed according to an embodiment of the present invention is explained below.

$H_2$ gas is locally provided towards the silicon melt. In an embodiment, the distance between the silicon melt and a first supply tube for the $H_2$ gas is about 5 mm to 15 mm. If the distance is shorter than 5 mm, the temperature of the tube may rise due to the silicon melt and cause the tube to expand due to the thermal expansion and contact the melt. If the distance is greater than 15 mm, $H_2O$ may not be efficiently supplied to the surface of the silicon melt according to the present embodiment. In another embodiment, the distance between the silicon melt and the supply tube is no more than 10 mm. In yet another embodiment, the distance between the silicon melt and the supply tube is no more than 20 mm. The distance between the silicon melt and the supply tube may vary according to implementation.

Next, high pressure $O_2$ is supplied via a second supply tube towards the center of the $H_2$ gas supplied to the silicon melt. The $H_2$ gas supplied by the first supply tube reacts with the $O_2$ gas supplied by the second supply tube due to the high temperature of the silicon melt, thereby causing $H_2$ gas to burn. In this case, oxidizing engineering used in semiconductor apparatus manufacturing is applicable to the process, that is, water vapor is generated by burning hydrogen, which is well-known in the art. The water vapor goes deep into the silicon melt due to the ejection force of the $O_2$, thereby efficiently supplying water vapor to the silicon melt. The water vapor supplied into the silicon melt reacts with boron-bearing impurities therein, thereby removing boron from the silicon melt.

In an embodiment, $O_2$ is supplied at a pressure of 2 kg/cm². In another embodiment, flow rate of $H_2$ is 700 L/hour and of $O_2$ is 500 L/hour. In general, higher pressures result in better purification.

In addition, when $H_2O$ is supplied to the silicon melt, the stream of the high-pressure $O_2$ gas causes a dimple to be formed on the surface of the silicon melt. This increases the inversion radius of the silicon melt circulating in the crucible 2, which facilitates mixing. The increased mixing allows the impurities to be distributed more evenly and the silicon melt to be purified in a shorter time.

The following surprising results have been found by the inventors: (1) Boron-bearing impurities can be removed efficiently by supplying $H_2O$ effectively to the surface of the silicon melt; (2) the contact area for $H_2O$ penetration is increased by forming a dimple on the silicon melt by supplying a gas at high pressure towards the silicon melt; and (3)

mixing is facilitated by the dimple formed on the silicon melt by the high-pressure gas. The high-pressure gas is oxygen gas in the present embodiment.

In other embodiments, in order to efficiently form the aforementioned dimple, argon (Ar) gas may be provided from another tube (e.g., a third supply tube) separate from the tube providing $O_2$. The argon supplied by these embodiments may be damped, obviating, reducing, or supplementing the water supplied through $O_2$ and $H_2$ gases. In an embodiment, the Ar flow rate is 100 L/min, the damping percentage is 100%, and the damping method is diffusing fine Ar gas across water.

The degree of vacuum also plays a significant role in embodiments of the present invention. Each impurity incorporated in the silicon raw material has an inherent boiling point and vapor pressure that depends according to the pressure level in the vessel. In an embodiment, the temperature of silicon melt without influence of plasma is 1550° C., and the chamber pressure is 0.1 Torr. In this embodiment, it is found that the silicon melt reacts vigorously at the interface with the quartz crucible 2, and superheating occurs at the surface of the silicon melt. However, if the chamber pressure is raised to 10 Torr with the other conditions remaining the same, the degree of superheating will be reduced. Therefore, the present embodiment, the chamber pressure of 0.1 Torr or more is preferred.

The inventors have found that the boiling temperatures of the impurities in the silicon raw material vary considerably depending on the vacuum level (or chamber pressure). For example, the difference in boiling temperatures between vacuum levels of 0.1 Torr and 10 Torr is about 500° C. for B, about 400° C. for Fe, about 350° C. for Al, and about 320° C. for Ni. In other words, the purification temperature difference of the metal impurities caused by a pressure difference of 100 times is around 300° C.

Burning hydrogen from $H_2$ and $O_2$ to form $H_2O$ as described above is especially effective in removing boron-bearing impurities from the silicon melt. The addition of damped Ar not only contributes to removing boron-bearing impurities, but also facilitates circulation of the silicon melt within the crucible 2, which allows for more uniform purification. That is, by injecting damped Ar to form local temperature differences in the silicon melt, a dimple is formed, and as a result, the contact area with the silicon melt can be increased, resulting in more effective purification. Due to this multiplication effect, mixing can be done in a shorter period, reducing the time required for purification. This result is confirmed in the following experiment: flow rate of damped Ar: 100 L/min. Fine Ar bubbles are formed in water, and the experiment is controlled so that the Ar bubbles remain at a depth of 50 cm in the water when Ar in the bubbles has a relative dampness of 100%. This achieves the effect of reducing the purification time by 5%.

When the temperature of the silicon melt is kept at 1450° C., the temperature in the vessel will rise as a result of providing damped Ar via the plasma arc heater. This suggests that, in the plasma, damped portions of the argon gas will decompose into $H_2$ and $O_2$, and a portion of $H_2$ will combust. Also, under the above conditions, analysis of the exhaust gases suggests that the damped portions and Si react to form monosilanes ($SiH_4$). In other words, the result of adding damped Ar will give rise to $O_2$, $H_2$ and $SiH_4$.

The following methods for purifying metallurgical silicon are described, in reference to the drawings, using embodiments that are modifications of a conventional apparatus for growing single silicon crystals.

The apparatus shown in FIGS. 2 to 7 includes a vessel 10, a vacuum exhaust tube 11, a crucible 20, safety means 21 and 31 for preventing penetration by plasma, a crucible support 30, a heater 40, a plasma arc heater 50, a gas supply tube 60, silicon melt 100, and a manipulating mechanism 80 for rotating and shifting the crucible support 30 up and down.

Before silicon raw material containing impurities is chemically purified, it is heated by the heater 40 to form the silicon melt 100. Then, one or more of the various methods for purification according to the present invention are applied, which include the following:

1. Independent Gas Provision: An independent supply tube 60 supplies highly pressurized $O_2$ gas towards $H_2$ supplied by the plasma arc heater to the center of the surface of the silicon melt 100 in the crucible 20 so as to generate water vapor ($H_2O$). The generated water vapor goes into the silicon melt, as a result of the high-pressure ejection of $O_2$ in order to effectively provide the silicon melt 100 with the water vapor that is used to remove impurities.

Figure 6:
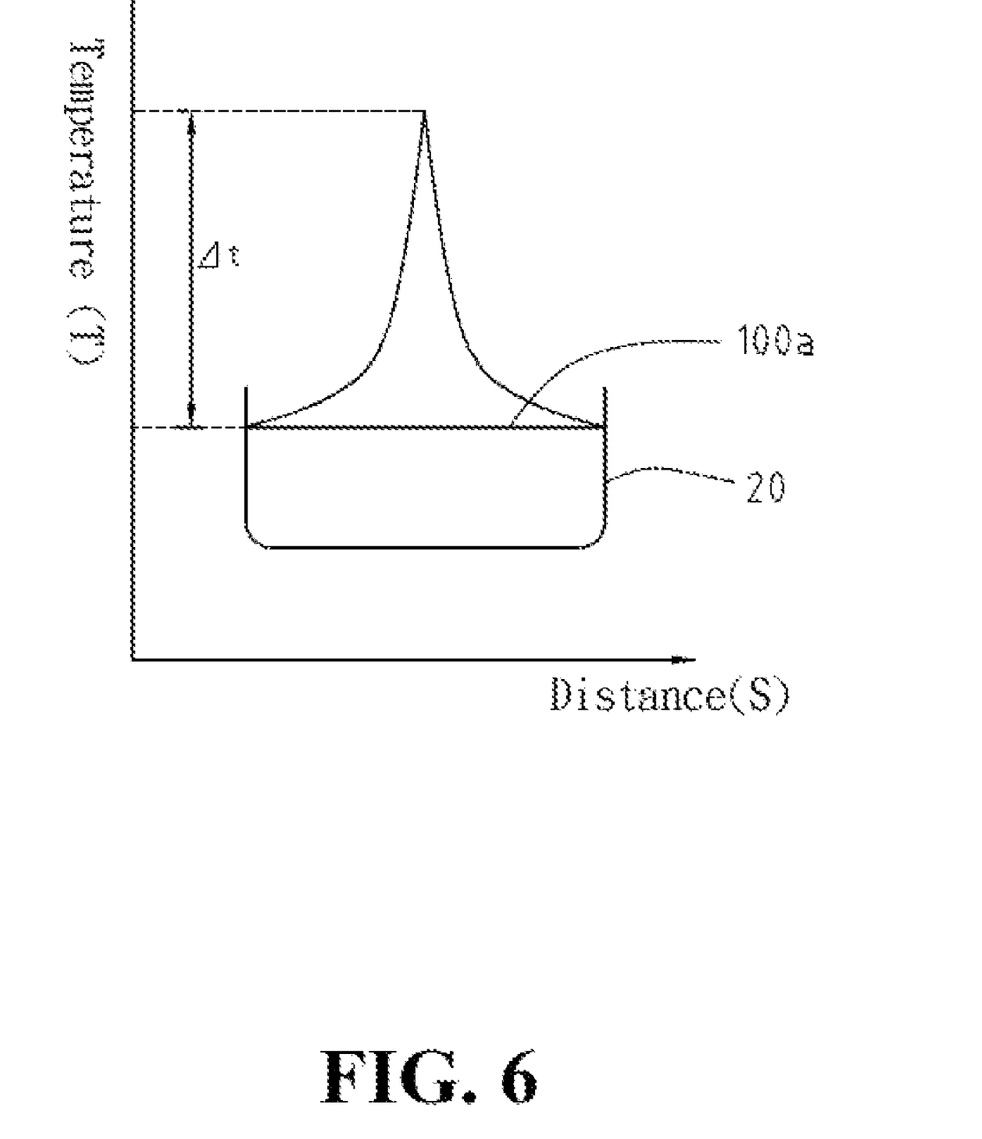
FIG. 6 is a graph depicting an instantaneous temperature distribution across the surface of a silicon melt when irradiated by plasma.

2. Intermittent Heating and Gas Provision: Irradiation of the silicon melt 100 in the crucible 20 is intermittently performed by the plasma arc heater 50, so that a reproducible temperature gradient such as that shown in FIG. 6 is formed at the surface 100a of the silicon melt in the crucible 20. This forms a temperature distribution across the silicon melt 100 in the crucible 20, preventing the crucible from melting while providing adequate, stable and uniform conditions for metallurgical silicon purification. FIG. 6 shows a graph depicting an instantaneous temperature distribution across the silicon melt surface 100a in the crucible 20 when irradiated by plasma. In addition, purifying gases for forming the water vapor are provided intermittently to avoid a rise in pressure caused by continuous provision of the water vapor. Moreover, a pressure pump is used to adjust pressure via the vacuum exhaust tube 11 before $H_2O$ vaporizes from liquid to gas and causes the pressure to rise, thus providing a safe and stable process environment for purifying metallurgical silicon.

3. Addition of Chemicals: Chemicals such as Ca, Si and Mg are added to the raw silicon material to react with the impurities therein, and the resulting compounds formed by reaction between the chemicals and the silicon have lower densities relative to metallurgical silicon, which allows the impurities to be easily removed. A method according to an embodiment includes adding soluble chemicals whose vitreous structures may be network modifiers including, for example, calcium chloride ($CaCl_2$) and magnesium chloride ($MgCl_2$), and soluble chemicals whose vitreous structures may be network formers including, for example, sodium metasilicate ($Na_2SiO_3$). These soluble chemicals contact or blend with the metallurgical silicon to form slag with the impurities in the silicon raw material, which floats up to the silicon melt surface 100a and may be easily evaporated.

Figure 7:
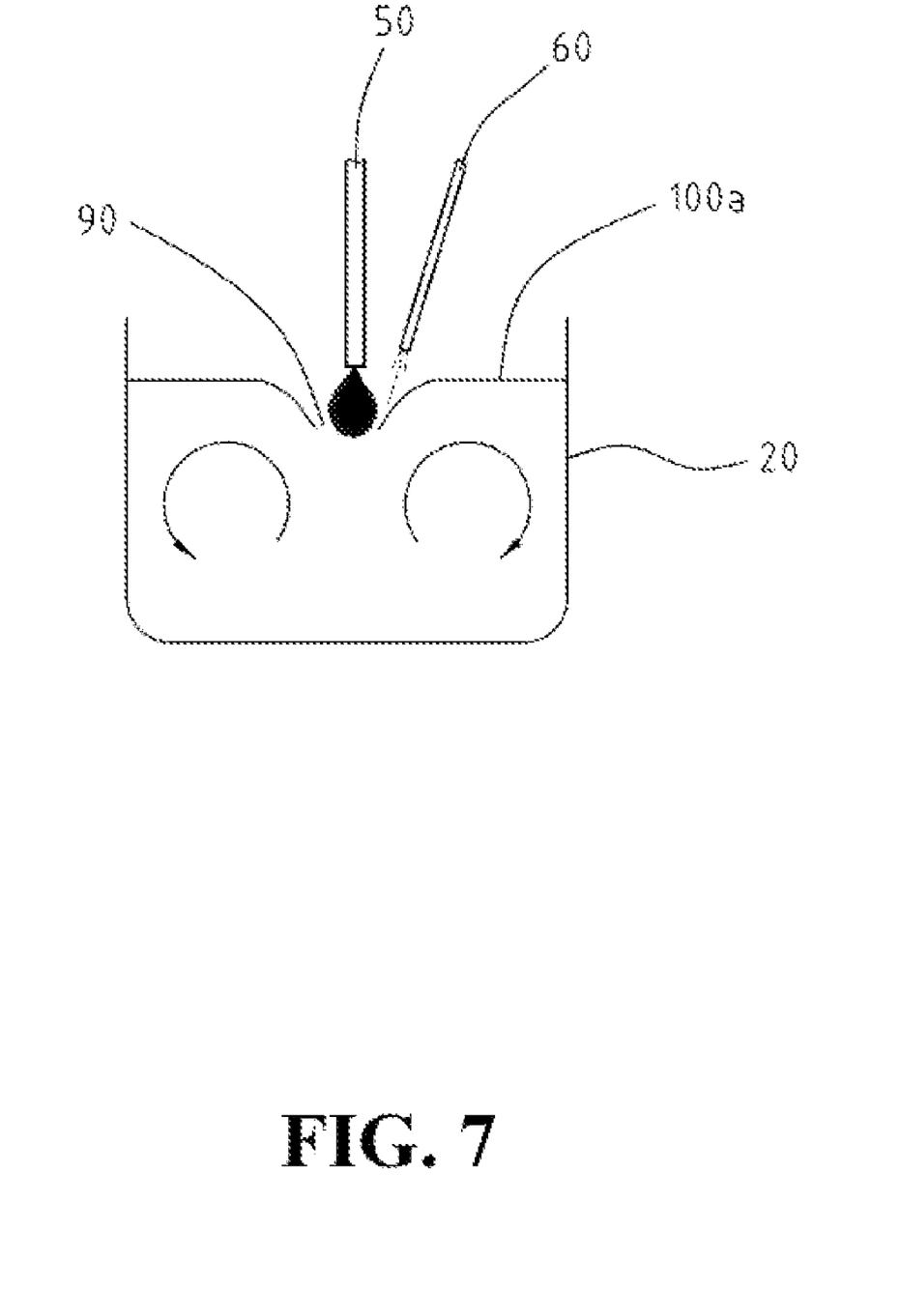
FIG. 7 is a schematic diagram illustrating mixing the silicon melt, according to an embodiment of the present invention.

4. Silicon Melt Mixing: By ejecting purifying gases with high pressure via the supply tube 60 towards the surface 100a of the silicon melt in the crucible 20, the stream of the high-pressure purifying gases forms a dimple 90 on the silicon melt surface 100a as shown in FIG. 7, thereby increasing the contact area for $H_2O$ when $H_2O$ is provided to the silicon melt. Meanwhile, due to the increase in the high-temperature area from irradiating with plasma via the dimple 90 by the plasma arc heater 50, accompanied by heat convection due to different temperatures across the silicon melt 100 in the crucible 20, circulation within the silicon melt 100 in the crucible 20 is encouraged.

5. Vacuum Control: By changing the degree of vacuum in the vessel 10, evaporation conditions of the impurities in the silicon raw material can be controlled and superheating of the silicon melt 100 can be avoided, thus ensuring the safety of the metallurgical silicon purifying process.
6. Crucible Shifting: The crucible 20 is moved, for example by rotating, or shifting it vertically or horizontally shifted relative to the heater 40 by the manipulating mechanism 80 provided underneath the vessel 10, so that the solidus-liquidus interface of the silicon melt 100 can be moved to achieve one-directional cooling purification, without the need for temperature segregation coefficient management of the concentration of remaining impurities in the silicon melt 100 with respect to the solidus-liquidus line. Since the vertical shifting and rotating of the crucible 20 are related to the one-directional cooling purification using the segregation coefficient, when the silicon melt 100 is slowly cooled down and solidified, impurities at the solidus side are purified. The embodiments of the present invention eliminate the need for temperature management to cool the silicon melt 100 by performing one-directional purification through changing the position of the crucible 20 relative to the heater 40, and in turn shifting the solidus-liquidus interface. In this case, the shifting speed of the solidus-liquidus interface is dependent on the amount of silicon melt 100 in the crucible 20. In an embodiment, average shifting speeds of less than 1.0 mm/min are used to obtain desired results.

It can be understood from the purifying methods according to the embodiments of the present invention that the effective circulation of silicon melt 100 has great influence on the uniform removal of impurities therein. If there is too little circulation, the silicon quality varies. Heat convection in the silicon melt 100 in the crucible 20 is caused by temperature differences across the vertical profile. However, the following methods can be performed in parallel to obtain better circulation:

1. Moving the bottom of the crucible 20 to the bottom of the heater 40 to reduce its bottom temperature, wherein the center of the heater 40 is aligned with the center of the crucible 20;
2. Forming a dimple 90 on the surface of the silicon melt 100 to increase the inversion radius of the circulation, thereby enhancing uniform purification of the impurities;
3. Increasing the high-temperature area by irradiating with plasma through the dimple 90 to increase the inversion radius of the circulation, thereby enhancing uniform purification of the impurities; and
4. Irradiating with plasma intermittently to prevent overheating of the overall silicon melt 100 and to maintain a suitable temperature gradient.

Figure 4:
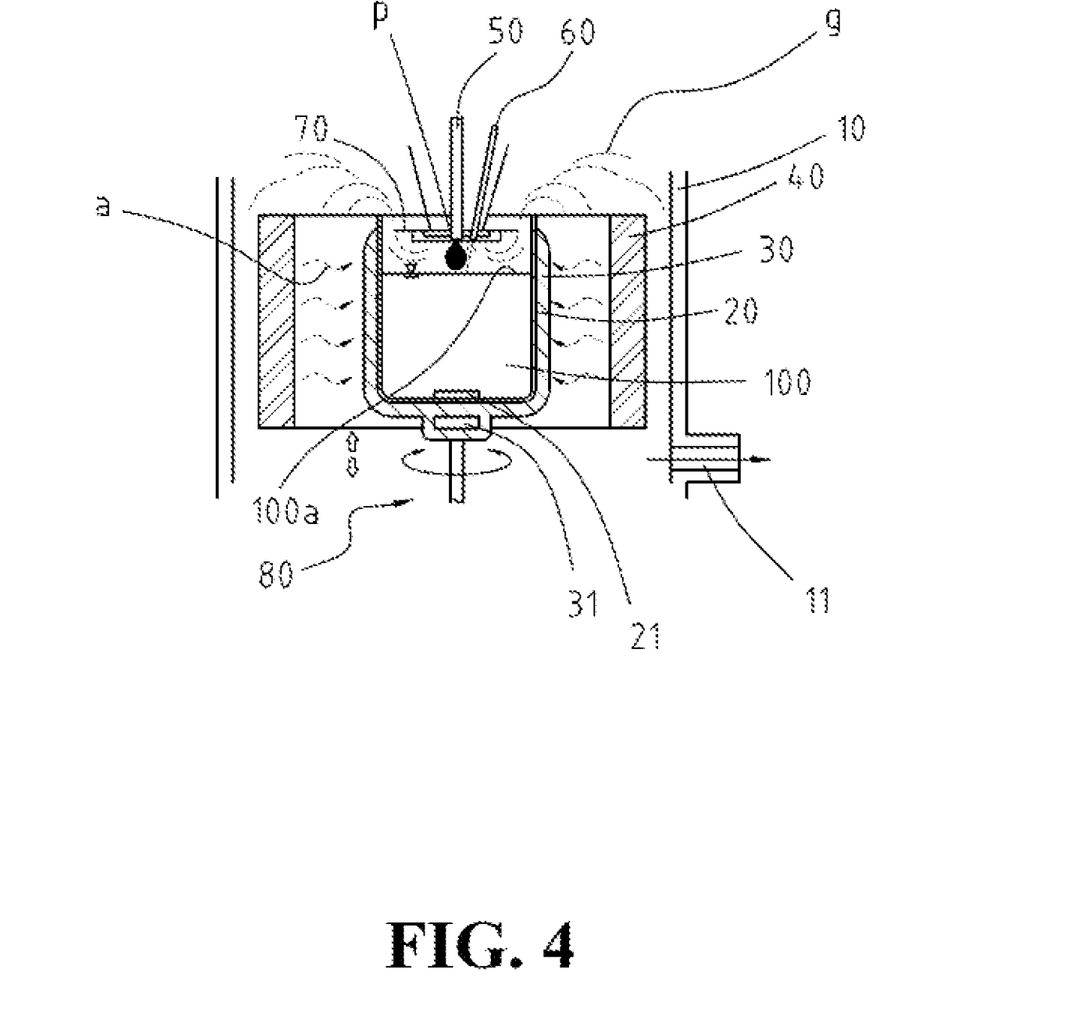
FIG. 4 is a schematic diagram illustrating simplified gas flow according to an embodiment of the present invention.

FIG. 4 is a schematic diagram depicting gas flow when heated according to an embodiment of the present invention. This embodiment comprises a guide 70 with fins for controlling gas flow, in particular for allowing the purifying gases supplied by the gas supply tube 60 to contact the silicon melt 100. Reference letter "a" indicates heat flow from the heater 40, "p" indicates plasma, and "g" indicates gas flow.

The steps and conditions performed by the present embodiment shown in FIG. 4 are as follows:

The temperature of the silicon melt 100 is about 1550° C., the power supplied to the plasma is 20 KW, and the maximum temperature is about 3000° C. The temperature distribution of the silicon melt 100 in the crucible 20 is from about 1550° C. to 3000° C. The purifying gases supplied by the supply tube 60 in FIG. 4 are high in temperature and will eventually form oxygen, hydrogen and/or monosilanes ($SiH_4$) in liquid or solid form and/or a mixture thereof. In order to prevent oxidation of the silicon melt 100, Ar is provided to the silicon melt surface 100a.

The temperature distribution has a significant effect on the purifying steps. There are various impurities that need to be removed. The chemical reactions, evaporation, transformation, and other chemical activities of these impurities depend on temperatures. The temperatures distribution within the silicon melt allows parts of the silicon melt to be increased to a high temperature necessary to cause certain materials to evaporate, e.g., evaporate boron at about 3527° C.

In conventional methods, although water is provided via the supply tube 60 to the vessel 10, it is evaporated before it reaches the silicon melt 100 due to the high temperature of silicon melt, making it difficult to perform purification effectively.

Figure 5:
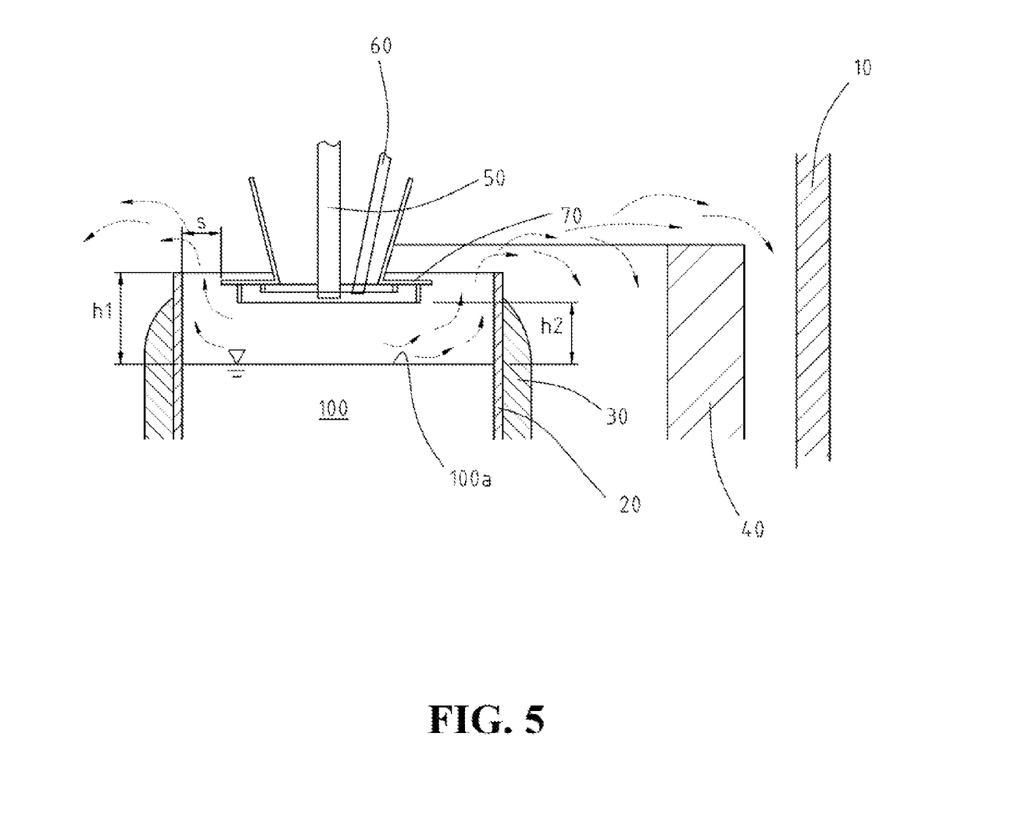
FIG. 5 is a detailed diagram illustrating gas flow and control of the gas flow according to an embodiment of the present invention.

In order to solve this problem, the gas flow is controlled as shown in FIG. 5, wherein the arrows indicate the direction of gas flow. A high-power vacuum machine is used to create high-speed gas flow, and the gas flow is directed by the guide 70 to go against the rising gas flow from the silicon melt 100 caused by heating the silicon melt surface 100a, so that the damped gases can contact the silicon melt surface 100a effectively. Moreover, in order to increase efficiency, the distance (h1) from one end of the gas flow guide 70 to the silicon melt surface 100a, the distance (h2) from the gas flow controlling fin to the silicon melt 100, and the distance (S) from the end of the guide 70 to the inner circumference of the crucible are very important. The distance between the guide 70 and the silicon melt surface 100a can be adjusted by controlling the crucible using the manipulating mechanism 80, thereby obtaining good recirculation. In various embodiments, 100 mm, 40 mm and 30 mm for h1, h2 and S, respectively, obtain good results, and rate at which exhaust is let out by the vacuum machine is 15 $m^3$/min.

Although the methods above perform purification on the silicon melt surface 100a efficiently, the purifying gases/elements cannot be provided inside the silicon melt 100. In other words, even if the silicon melt surface 100a is purified, the distribution of the impurities in the silicon melt 100 inside the crucible 20 is still not even, and so mixing of the silicon melt 100 is necessary.

As shown in FIGS. 6 and 7, the uneven distribution of the impurities in the silicon melt 100 may be solved by controlling the heating temperature gradient and the high-pressure gas stream that facilitates mixing. FIG. 7 illustrates mixing of the silicon melt 100 in the present embodiment. As shown in FIG. 7, the silicon melt surface 100a in the crucible 20 has a higher temperature than silicon at the bottom due to plasma irradiation, and a dimple 90 is formed on the silicon melt surface 100a by the high-pressure stream from the supply tube 60 or the plasma arc heater 50, which allows the contact area between the purifying gases and the silicon melt 100 to increase. When accompanied by heat convection in the crucible caused by the temperature distribution across the silicon melt 100 in the crucible, circulation can be sped up and uniform purification can be effectively obtained.

In addition, such actions can be repeated to reduce the rising temperature of the silicon melt 100 due to plasma irradiation and maintain the effect of adding water or damped gases. A plurality of irradiation sources can also be used.

As described above, the present invention relates to methods for purifying metallurgical grade silicon. The purified silicon (e.g., purified polysilicon) may be used in manufacturing solar cells and other suitable devices. In an embodiment, a method provides low-cost solar-grade silicon from low-purity metallurgical grade silicon by modifying the existing single-crystal silicon drawing apparatus used by the semiconductor industry.

A person skilled in the art would understand that the examples and embodiments described herein are for illustrative purposes only and that various modifications or changes thereof would be possible without departing from the spirit and purview of this invention. The scope of the present invention should be construed based on the appended claims.

What is claimed is:

1. A method for purifying silicon bearing materials for photovoltaic applications, the method comprising:
    providing metallurgical silicon into a crucible apparatus;
    subjecting the metallurgical silicon to at least a thermal process to cause the metallurgical silicon to change in state from a first state to a second state, the second stage being a molten state not exceeding 1500 Degrees Celsius, the power to the thermal process being provided intermittently;
    providing at least a purification gas towards the surface of the silicon melt through an independent supply tube, the supply of the purification gas being provided intermittently;
    causing at least a first portion of impurities to be removed from the metallurgical silicon in the molten state;
    cooling the molten metallurgical silicon from a lower region to an upper region to cause the lower region to solidify while a second portion of impurities segregate and accumulate in a liquid state region; and
    solidifying the liquid state region to form a resulting silicon structure having a purified region and an impurity region,
    whereupon the purified region is characterized by a purity of greater than 99.9999%.

2. The method of claim 1 wherein the thermal process uses a plasma gun or arc heater.

3. The method of claim 2 wherein the plasma gun or arc heater provides $H_2$ gas towards the surface of the silicon melt; and wherein the independent supply tube provides $O_2$ towards the surface of the silicon melt, the $H_2$ from the plasma gun or arc heater and the $O_2$ from the independent supply tube forming water vapor ($H_2O$) that is injected into the silicon melt.

4. The method of claim 2 wherein the duty cycle of intermittent plasma irradiation is below 50%.

5. The method of claim 1 wherein the thermal process has a source of about 3000 Degrees Celsius.

6. The method of claim 1 wherein the molten metallurgical silicon has a temperature profile characterized by a higher temperature region within a center region and a lower temperature region within an edge region of the crucible apparatus.

7. The method of claim 1 further comprising rotating and shifting the crucible through a manipulating mechanism to move the solidus-liquidus interface of the silicon melt to achieve one-directional cooling purification.

8. The method of claim 1 wherein the thermal process comprises a convection process of the molten state.

9. The method of claim 1 wherein the molten state is substantially free from any foreign objects for circulating the molten metallurgical silicon.

10. The method of claim 1 further comprising subjecting an upper molten region of the metallurgical silicon with an inert blanket of gas; and subjecting a portion of the upper molten region to a hydrogen gas to cause a reaction and remove a boron impurity with the hydrogen gas to remove the oxygen impurity,
    wherein the metallurgical silicon has a purity of about 99%.

11. The method of claim 1 further comprising subjecting a region of the molten metallurgical silicon to a hydrogen species to remove a boron impurity using a gas selected from at least one of $B_2O_3$, $B_2O_3H_2O$, $BH_4$, $B_2H_6$, $BH_3$, $H_3BO_3$, $HBO_2$, $HBO_3$, $H_4B_2O_4$, $H_3BO_2$, $H_3BO$, $H_2B_4O_7$, $B_2O_2$, $B_4O_3$ or $B_4O_5$.

12. The method of claim 11 wherein the hydrogen species is injected using one or more channel regions.

13. The method of claim 1 wherein the crucible is maintained in a vacuum to keep the molten metallurgical silicon free from external contaminants.

14. The method of claim 13 wherein the vacuum is selected to achieve a desired impurity removal characteristic from the molten metallurgical silicon.

* * * * *